United States Patent
Cho

(10) Patent No.: US 10,837,996 B2
(45) Date of Patent: Nov. 17, 2020

(54) SEMICONDUCTOR DEVICE

(71) Applicant: SK hynix Inc., Icheon-si Gyeonggi-do (KR)

(72) Inventor: Na Yeon Cho, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 174 days.

(21) Appl. No.: 16/013,401

(22) Filed: Jun. 20, 2018

(65) Prior Publication Data

US 2019/0041451 A1    Feb. 7, 2019

(30) Foreign Application Priority Data

Aug. 1, 2017    (KR) .......................... 10-2017-0097780

(51) Int. Cl.
*G01R 31/26*    (2020.01)
*H01L 27/088*    (2006.01)

(52) U.S. Cl.
CPC ..... *G01R 31/2628* (2013.01); *G01R 31/2621* (2013.01); *H01L 27/088* (2013.01)

(58) Field of Classification Search
CPC .... G01R 31/00; G01R 31/26; G01R 31/2607; G01R 31/2621; G01R 31/2628; H01L 27/00; H01L 27/02; H01L 27/04; H01L 27/08; H01L 27/085; H01L 27/088; G11C 7/00; G11C 7/10; G11C 7/1051; G11C 7/1078; G11C 8/00; G11C 8/10; G11C 29/00; G11C 29/04; G11C 29/50

USPC .. 324/500, 512, 519–522, 525, 537, 762.01, 324/762.08, 762.09, 600, 649, 691, 713, 324/715, 718

See application file for complete search history.

(56) References Cited

U.S. PATENT DOCUMENTS

| 7,868,606 | B2* | 1/2011 | Meterelliyoz | H01L 22/34 324/750.3 |
| 2004/0257148 | A1* | 12/2004 | Tobita | H02M 3/07 327/536 |
| 2013/0322188 | A1* | 12/2013 | Ono | G11C 7/00 365/189.011 |
| 2015/0154908 | A1* | 6/2015 | Nam | G09G 3/3233 345/76 |
| 2016/0020703 | A1* | 1/2016 | Gong | H02M 3/33592 363/21.14 |
| 2016/0223609 | A1* | 8/2016 | Hwang | H03K 17/102 |

FOREIGN PATENT DOCUMENTS

| KR | 100532395 B1 | 1/2006 |
| KR | 1020120076435 A | 7/2012 |
| KR | 1020130018800 A | 2/2013 |

* cited by examiner

*Primary Examiner* — Hoai-An D. Nguyen
(74) *Attorney, Agent, or Firm* — William Park & Associates Ltd.

(57) ABSTRACT

A semiconductor device includes a change detection circuit and a change determination circuit. The change detection circuit generates a detection voltage having a voltage level varied in accordance with a change of a transistor. The change determination circuit enables a determination signals based on the voltage level of the detection voltage.

17 Claims, 4 Drawing Sheets

240

SEMICONDUCTOR DEVICE

CROSS-REFERENCES TO RELATED APPLICATION

The present application claims priority under 35 U.S.C. § 119(a) to Korean application number 10-2017-0097780, filed on Aug. 1, 2017, in the Korean Intellectual Property Office, which is incorporated herein by reference in its entirety.

BACKGROUND

1. Technical Field

Various embodiments may generally relate to a semiconductor integrated circuit, more particularly, to a semiconductor device.

2. Related Art

A semiconductor device may be configured to receive and output electrical signals. The semiconductor device may include a plurality of transistors.

According to related arts, the semiconductor device including the transistors may malfunction in accordance with process changes, voltage changes, temperature changes, etc.

SUMMARY

In accordance with embodiments of the present disclosure, a semiconductor device may include a change detection circuit and a change determination circuit. The change detection circuit may be configured to generate a detection voltage having a voltage level varied in accordance with a change of a transistor. The change determination circuit may be configured to enable any one of a plurality of determination signals based on the voltage level of the detection voltage.

BRIEF DESCRIPTION OF THE DRAWINGS

Aspects, features, and advantages of the subject matter of the present disclosure are described in detail with reference to the figures listed below.

DETAILED DESCRIPTION

Various embodiments will be described in detail with reference to the accompanying drawings. The drawings are schematic illustrations of various embodiments (and intermediate structures). As such, variations from the configurations and shapes of the illustrations as a result, for example, of manufacturing techniques and/or tolerances, are to be expected. Thus, the described embodiments should not be construed as being limited to the particular configurations and shapes illustrated herein but may include deviations in configurations and shapes which do not depart from the spirit and scope of the present disclosure as defined in the appended claims.

The present disclosure is described herein with reference to cross-section and/or plan illustrations of idealized embodiments of the present disclosure. However, embodiments of the present disclosure should not be construed as limiting the inventive concept. Although a few embodiments will be shown and described, it will be appreciated by those of ordinary skill in the art that changes may be made in these embodiments without departing from the principles and spirit of the present disclosure.

Embodiments of the present disclosure may provide a semiconductor device that may be capable of detecting changes of transistors.

In accordance with examples of embodiments, an operational timing of a semiconductor device may be changed by detecting changes of transistors. Thus, the semiconductor device may have improved operational reliability.

Figure 1:
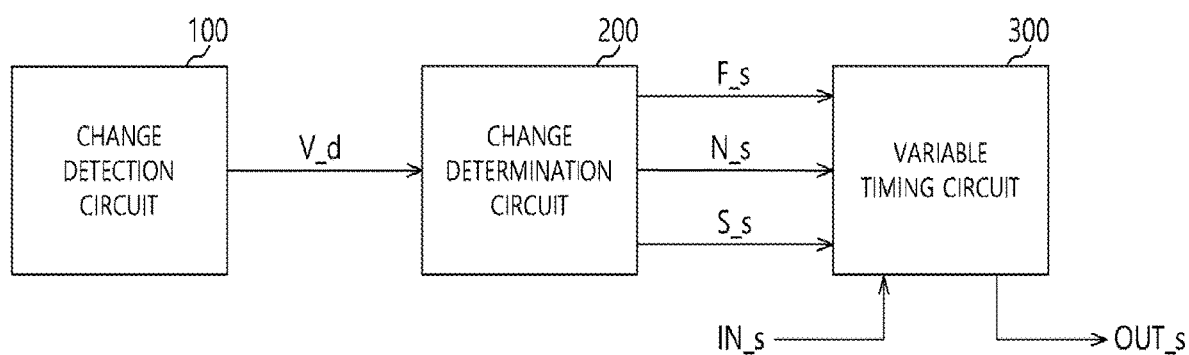
FIG. 1 is a block diagram illustrating a semiconductor device in accordance with various embodiments.

FIG. 1 is a block diagram illustrating a semiconductor device in accordance with various embodiments.

Referring to FIG. 1, a semiconductor device of an embodiment may include a change detection circuit 100, a change determination circuit 200, and a variable timing circuit 300.

The change detection circuit 100 may be configured to generate a detection voltage V_d. The detection voltage V_d may have a voltage level varied in accordance with a change of a transistor. For example, the change detection circuit 100 may generate the detection voltage V_d using turn-on resistances of two transistors of the same type having different sizes. Particularly, the change detection circuit 100 may generate the detection voltage V_d having a proportionally higher voltage level as the turn-on resistances of the two transistors decrease. In contrast, the change detection circuit 100 may generate the detection voltage V_d having a proportionally lower voltage level as the turn-on resistances of the two transistors increase.

The change determination circuit 200 may be configured to enable any one of first to third determination signals F_s, N_s, and S_s in response to the detection voltage V_d. For example, when the detection voltage V_d is higher than a first target level, the change detection circuit 200 may enable the first determination signal F_s. When the detection voltage V_d is lower than the first target level and higher than a second target level, the change detection circuit 200 may enable the second determination signal N_s. When the detection voltage V_d is lower than the second target level, the change detection circuit 200 may enable the third determination signal S_s. Here, the first target level may be higher than the second target level.

The variable timing circuit 300 may be configured to vary a delay amount in response to the first to third determination signals F_s, N_s, and S_s. The variable timing circuit 300 may delay an input signal IN_s by a varied delay amount to output the delayed input signal as an output signal OUT_s. For example, when the first determination signal F_s is enabled, the variable timing circuit 300 may delay the input signal IN_s by a first delay amount to output a delayed input signal as the output signal OUT_s. When the second determination signal N_s is enabled, the variable timing circuit 300 may delay the input signal IN_s by a second delay amount to output a delayed input signal as the output signal OUT_s. When the third determination signal S_s is enabled, the variable timing circuit 300 may delay the input signal IN_s by a third delay amount to output a delayed input signal as the output signal OUT_s. Here, the first delay amount may be greater than the second delay amount. The second delay amount may be greater than the third delay amount.

Figure 2:
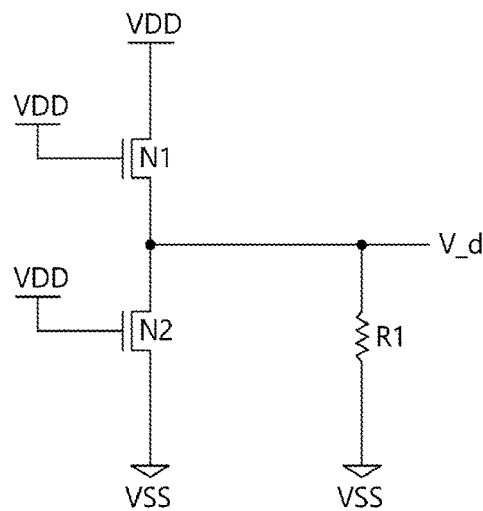
FIG. 2 is a circuit diagram illustrating a change detection circuit of FIG. 1 in accordance with an embodiment.

FIG. 2 is a circuit diagram illustrating a change detection circuit of FIG. 1.

Referring to FIG. 2, the change detection circuit 100 may include a first transistor N1, a second transistor N2, and a first resistor R1. The first transistor N1 may include a gate configured to receive an external voltage VDD, and a drain configured to receive the external voltage VDD. The second transistor N2 may include a gate configured to receive the external voltage VDD, a drain connected to a source of the first transistor N1, and a source connected to a ground terminal VSS. The first resistor R1 may include a first end connected to a node connected between the first transistor N1 and the second transistor N2, and a second end connected to the ground terminal VSS. The detection voltage V_d may correspond to a voltage outputted from the node connected between the first transistor N1 and the second transistor N2. In an embodiment, the first transistor N1 and the second transistor N2 may be n-channel metal oxide semiconductor (NMOS) transistors. In other embodiments, the first transistor N1 and the second transistor N2 may be any type of transistor.

In embodiments of the present disclosure, the first transistor N1 may have a type substantially the same as that of the second transistor N2. The first transistor N1 may have a size different from that of the second transistor N2. A change of a turn-on resistance of one of the first and second transistors N1 and N2 may be higher than a change of the other turn-on resistance of the first and second transistors N1 and N2 in accordance with changes of a process, a temperature, and a voltage level [i.e., in accordance with process, voltage, and temperature (PVT) variations]. Particularly, the first and second transistors N1 and N2 may have different channel lengths or widths. For example, the first and second transistors N1 and N2 may have a same channel length and different channel widths. Alternatively, the first and second transistors N1 and N2 may have a same channel width and different channel lengths. Further, the first and second transistors N1 and N2 may have different channel lengths and different channel widths. An amount of current flowing from the drain to the source in the first transistor N1 when the first transistor N1 is turned-on may be greater than an amount of current flowing from the drain to the source in the second transistor N2 when the second transistor N2 is turned-on.

Figure 3:
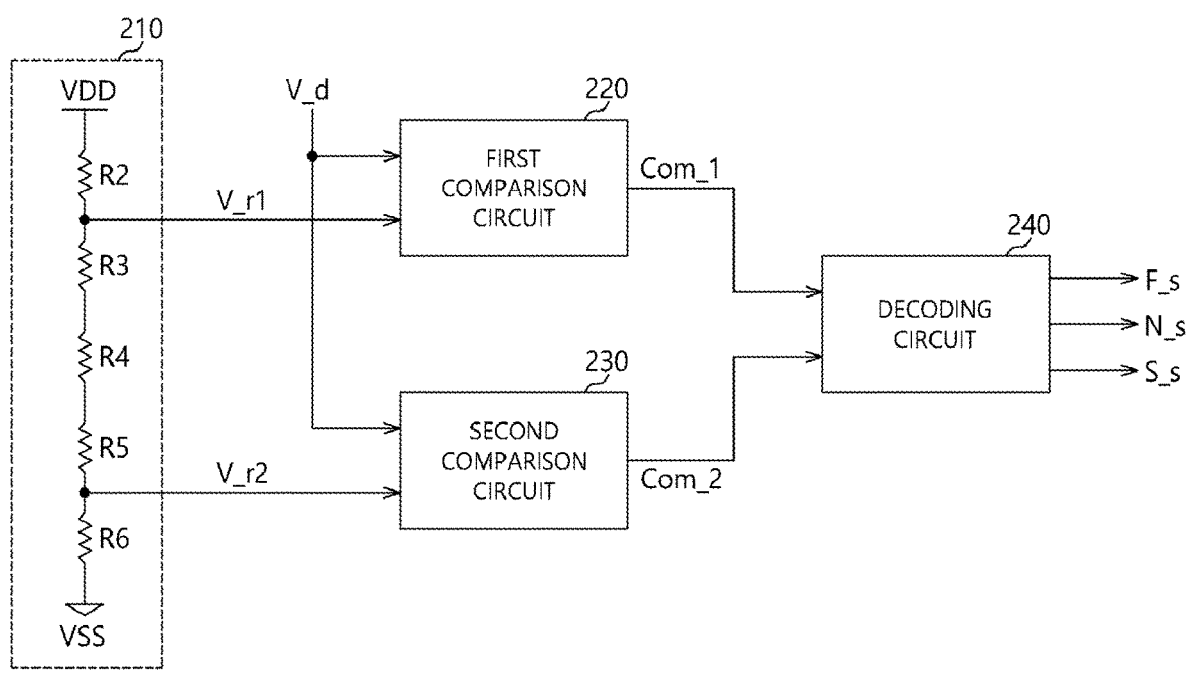
FIG. 3 is a block diagram illustrating a change determination circuit of FIG. 1 in accordance with an embodiment.

FIG. 3 is a block diagram illustrating a change determination circuit of FIG. 1.

Referring to FIG. 3, the change determination circuit 200 may include a target voltage generation circuit 210, a first comparison circuit 220, a second comparison circuit 230, and a decoding circuit 240.

The target voltage generation circuit 210 may distribute the external voltage VDD to generate a first target voltage V_r1 and a second target voltage V_r2. The first target voltage V_r1 may be higher than the second target voltage V_r2.

The target voltage generation circuit 210 may include second to sixth resistors R2, R3, R4, R5, and R6. The second resistor R2 may have a first end configured to receive the external voltage VDD. The third resistor R3 may have a first end connected to a second end of the second resistor R2. The fourth resistor R4 may have a first end connected to a second end of the third resistor R3. The fifth resistor R5 may have a first end connected to a second end of the fourth resistor R4. The sixth resistor R6 may have a first end connected to a second end of the fifth resistor R5, and a second end connected to the ground terminal VSS. The first target voltage V_r1 may be outputted from a node connected between the second resistor R2 and the third resistor R3. The second target voltage V_r2 may be outputted from a node connected between the fifth resistor R5 and the sixth resistor R6.

The first comparison circuit 220 may compare the detection voltage V_d with the first target voltage V_r1 to generate a first comparison signal Com_1. For example, when the detection voltage V_d is higher than the first target voltage V_r1, the first comparison circuit 220 may enable the first comparison signal Com_1. In contrast, when the detection voltage V_d is lower than the first target voltage V_r1, the first comparison circuit 220 may disable the first comparison signal Com_1.

The second comparison circuit 230 may compare the detection voltage V_d with the second target voltage V_r2 to generate a second comparison signal Com_2. For example, when the detection voltage V_d is higher than the second target voltage V_r2, the second comparison circuit 230 may enable the second comparison signal Com_2. In contrast, when the detection voltage V_d is lower than the second target voltage V_r2, the second comparison circuit 230 may disable the second comparison signal Com_2.

The decoding circuit 240 may generate the first to third determination signals F_s, N_s, and S_s in response to the first and second comparison signals Com_1 and Com_2. For example, the decoding circuit 240 may enable any one of the first to third determination signals F_s, N_s, and S_s in response to the first and second comparison signals Com_1 and Com_2. Particularly, when the first and second comparison signals Com_1 and Com_2 are enabled, the decoding circuit 240 may enable the first determination signal F_s. When the first comparison signal Com_1 is disabled and the second comparison signal Com_2 is enabled, the decoding circuit 240 may enable the second determination signal N_s. When the first and second comparison signals Com_1 and Com_2 are disabled, the decoding circuit 240 may enable the third determination signal S_s.

Figure 4:
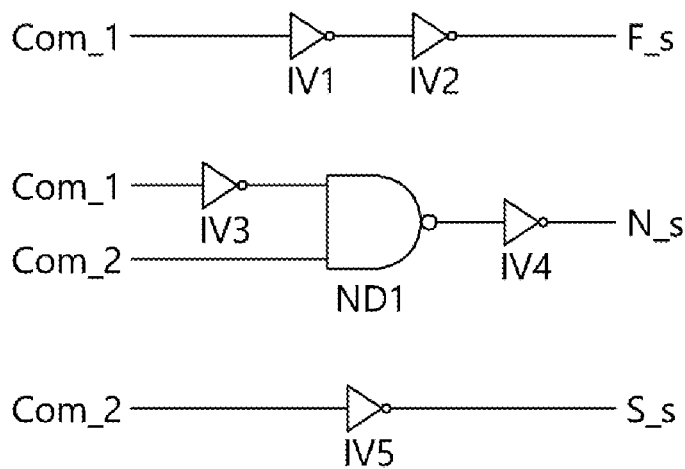
FIG. 4 is a circuit diagram illustrating a decoding circuit of FIG. 3 in accordance with an embodiment.

FIG. 4 is a circuit diagram illustrating a decoding circuit of FIG. 3.

Referring to FIG. 4, the decoding circuit 240 may include first to fifth inverters IV1~IV5 and an NAND gate ND1. The first inverter IV1 may have an input terminal configured to receive the first comparison signal Com_1. The second inverter IV2 may have an input terminal configured to receive an output signal of the first inverter IV1, and an output terminal configured to output the first determination signal F_s. The third inverter IV3 may have an input terminal configured to receive the first comparison signal Com_1. The NAND gate ND1 may be configured to receive the output signal of the third inverter IV3 and the second comparison signal Com_2. The fourth inverter IV4 may receive an output signal of the NAND gate ND1. The fourth inverter IV4 may output the inputted signal as the second determination signal N_s. The fifth inverter IV5 may receive the second comparison signal Com_2. The fifth inverter IV5 may reverse the second comparison signal Com_2 to output the reversed signal as the third determination signal S_s.

When the first comparison signal Com_1 is enabled to a high level and the second comparison signal Com_2 is enabled to a high level, the decoding circuit 240 may enable only the first determination signal F_s among the first to third determination signals F_s, N_s, and S_s. When the first comparison signal Com_1 is disabled to a low level and the second comparison signal Com_2 is to enabled to a high level, the decoding circuit 240 may enable only the second determination signal N_s among the first to third determination signals F_s, N_s, and S_s. When the first comparison signal Com_1 is disabled to a low level and the second comparison signal Com_2 is disabled to a low level, the decoding circuit 240 may enable only the third determination signal S_s among the first to third determination signals F_s, N_s, and S_s.

Figure 5:
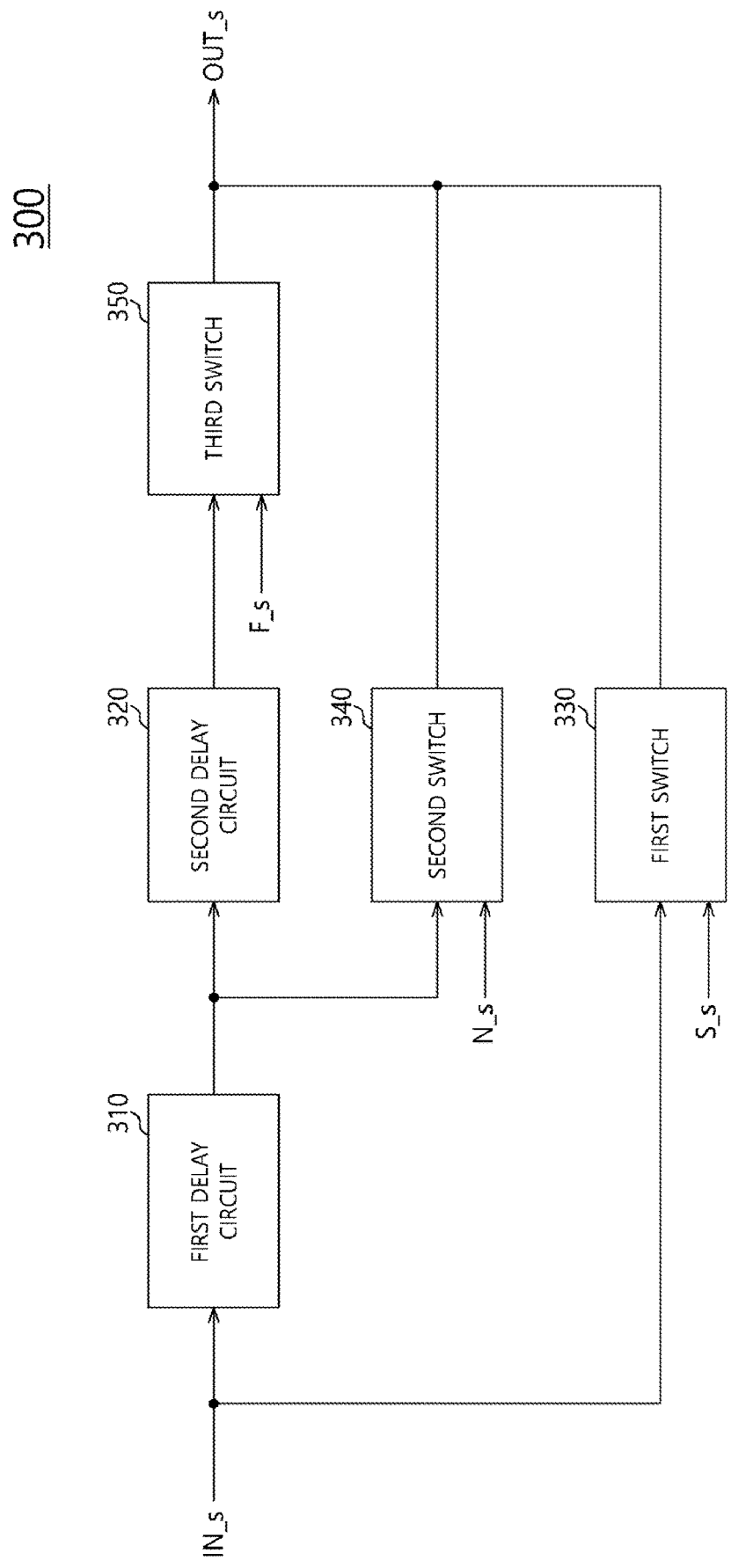
FIG. 5 is a block diagram illustrating a variable timing circuit of FIG. 1 in accordance with an embodiment.

FIG. 5 is a block diagram illustrating a variable timing circuit of FIG. 1.

Referring to FIG. 5, the variable timing circuit 300 may include a first delay circuit 310, a second delay circuit 320, a first switch 330, a second switch 340, and a third switch 350.

The first delay circuit 310 may receive the input signal IN_s. The first delay circuit 310 may delay and output the input signal IN_s. The second delay circuit 320 may receive the output signal of the first delay circuit 310. The second delay circuit 320 may delay and output the output signal of the first delay circuit 310.

The first switch 330 may output the input signal IN_s as the output signal OUT_s in response to the third determination signal S_s. For example, when the third determination signal S_s is enabled, the first switch 330 may output the input signal IN_s as the output signal OUT_s. In contrast, when the third determination signal S_s is disabled, the first switch 330 may block the input signal IN_s as the output signal OUT_s.

The second switch 340 may output the output signal of the first delay circuit 310 as the output signal OUT_s in response to the second determination signal N_s. For example, when the second determination signal N_s is enabled, the second switch 340 may output the output signal of the first delay circuit 310 as the output signal OUT_s. In contrast, when the second determination signal N_s is disabled, the second switch 340 may block the output signal of the first delay circuit 310 as the output signal OUT_s.

The third switch 350 may output the output signal of the second delay circuit 320 as the output signal OUT_s in response to the first determination signal F_s. For example, when the first determination signal F_s is enabled, the third switch 350 may output the output signal of the second delay circuit 320 as the output signal OUT_s. In contrast, when the first determination signal F_s is disabled, the third switch 350 may block the output signal of the second delay circuit 320 as the output signal OUT_s.

Hereinafter, operations of the semiconductor device in accordance with various embodiments will be described below.

The change detection circuit 100 may generate the detection voltage V_d having the voltage level varied in accordance with the change of the transistor. Referring to FIG. 2, the voltage level of the detection voltage V_d may be determined by the turn-on resistances of the first and second transistors N1 and N2. For example, when the voltage level of the external voltage VDD is about 10, the turn-on resistance of the first transistor N1 is about 4, the turn-on resistance of the second transistor N2 is about 6, and the detection voltage V_d set by a designer of the semiconductor device may be about 6. Here, the change of the turn-on resistance of the first transistor N1 may be higher than the change of the turn-on resistance of the second transistor N2 in accordance with the changes of the process, the temperature, and the voltage level. For example, when the turn-on resistance of the first transistor N1 is decreased by about half so that the turn-on resistance of the first transistor N1 is changed from 4 to 2, and the turn-on resistance of the second transistor N2 is decreased by about ⅓ so that the turn-on resistance of the second transistor N2 is changed from 6 to 4, the voltage level of the detection voltage V_d may be increased from 6 to 20/3(6.666 . . . ). When the turn-on resistance of the first transistor N1 is increased by about half so that the turn-on resistance of the first transistor N1 is changed from 4 to 6, and the turn-on resistance of the second transistor N2 is increased by about ⅓ so that the turn-on resistance of the second transistor N2 is changed from 6 to 8, the voltage level of the detection voltage V_d may be decreased from 6 to 40/7(5.714 . . . ).

In examples of embodiments, the varying of the detection voltage V_d by the change detection circuit 100 in accordance with the changes of the transistors may be numerically illustrated. However, the varying of the detection voltage V_d by the change detection circuit 100 in accordance with the changes of the transistors is not restricted to the above-mentioned values.

Further, in examples of embodiments, the change of the turn-on resistance of the first transistor N1 may be higher than the change of the turn-on resistance of the second transistor N2 in accordance with the changes of the process, the temperature, and the voltage level. Alternatively, in contrast, the change of the turn-on resistance of the first transistor N1 may be lower than the change of the turn-on resistance of the second transistor N2 in accordance with the changes of the process, the temperature, and the voltage level.

The change determination circuit 200 may detect the voltage level of the detection voltage V_d to enable any one of the first to third determination signals F_s, N_s, and S_s. For example, the change determination circuit 200 may compare the voltage level of the detection voltage V_d with two target voltages having different voltage levels to enable any one of the first to third determination signals F_s, N_s, and S_s.

Particularly, referring to FIG. 3, the change determination circuit 200 may compare the first and second target voltages V_r1 and V_r2 generated by the target voltage generation circuit 210 with the detection voltage V_d using the first and second comparison circuits 220 and 230. The first and second comparison circuits 220 and 230 may compare the first and second target voltages V_r1 and V_r2 with the detection voltage V_d to generate the first and second comparison signals Com_1 and Com_2. The first and second comparison signals Com_1 and Com_2 may be decoded through the decoding circuit 240 to enable any one of the first to third determination signals F_s, N_s, and S_s.

Particularly, the first target voltage V_r1 may be higher than the second target voltage V_r2. When the voltage level of the detection voltage V_d is higher than the voltage level of the first target voltage V_r1, the voltage level of the detection voltage V_d may also be higher than the voltage level of the second target voltage V_r2. Thus, the first and second comparison circuits 220 and 230 may output the enabled first and second comparison signals Com_1 and Com_2. When the first and second comparison signals Com_1 and Com_2 are enabled, the decoding circuit 240 may enable the first determination signal F_s among the first to third determination signals F_s, N_s, and S_s. When the voltage level of the detection voltage V_d is lower than the voltage level of the first target voltage V_r1 and higher than the voltage level of the second target voltage V_r2, the first comparison circuit 220 may output the disabled first comparison signal Com_1 and the second comparison circuit 230 may output the enabled second comparison signal Com_2. When the disabled first comparison signal Com_1 and the enabled second comparison signal Com_2 are inputted into the decoding circuit 240, the decoding circuit 240 may enable the second determination signal N_s among the first to third determination signals F_s, N_s, and S_s. When the voltage level of the detection voltage V_d is lower than the voltage level of the second target voltage V_r2, the voltage level of the detection voltage V_d may also be lower than the voltage level of the first target voltage V_r1. Thus, the first and second comparison circuits 220 and 230 may output the disabled first and second comparison signals Com_1 and Com_2. The decoding circuit 240 into which the disabled first and second comparison signals Com_1 and Com_2 are inputted may enable the third determination signal S_s among the first to third determination signals F_s, N_s, and S_s.

In examples of embodiments, the change determination circuit 200 may determine the voltage level of the detection voltage V_d using the two target voltages V_r1 and V_r2 to enable any one of the three determination signals F_s, N_s, and S_s. Alternatively, numbers of the target voltages and the determination signals are not restricted to specific numbers.

The variable timing circuit 300 may determine the delay amount in response to the first to third determination signals F_s, N_s, and S_s. The variable timing circuit 300 may delay the input signal IN_s by the determined delay amount and output the delayed input signal as the output signal OUT_s. Referring to FIG. 5, when the first determination signal F_s is enabled, the variable timing circuit 300 may delay the input signal IN_s through the first and second delay circuits 310 and 320 and output the delayed input signal as the output signal OUT_s. When the second determination signal N_s is enabled, the variable timing circuit 300 may delay the input signal IN_s through the first delay circuit 310 and output the delayed input signal as the output signal OUT_s. When the third determination signal S_s is enabled, the variable timing circuit 300 may output the input signal IN_s, which might not pass through the first and second delay circuits 310 and 320, as the output signal OUT_s.

According to examples of embodiments, the semiconductor device may detect the changes of the transistors. The semiconductor device may enable any one of the determination signals based on the detected results. Particularly, the semiconductor device may enable any one of the determination signals in accordance with the changed amounts of the transistors (i.e., in accordance with the amounts of the changes of the transistors). Further, the semiconductor device may determine the delay amount in accordance with the changed amounts of the transistors. The variable timing circuit may delay and output the input signal by the determined delay amount. Alternatively, examples of embodiments may also be applied to circuits such as a circuit for varying an internal voltage level in accordance with the changed amounts of the transistors, and a circuit for activating an internal circuit in accordance with the changed amounts of the transistors.

Presented embodiments of the present disclosure are intended to be illustrative and not to limit the present disclosure. Various alternative and functionally similar embodiments are possible. The present disclosure is not limited by the embodiments described herein. Nor is the present disclosure limited to any specific type of semiconductor device. Possible additions, subtractions, or modifications to presented embodiments falling within the scope of to the appended claims will be understood by those of skill in the art.

What is claimed is:

1. A semiconductor device comprising:
    a change detection circuit including at least one transistor for detecting process, voltage, and temperature (PVT) variations, and configured to generate a detection voltage having a voltage level varied in accordance with the PVT variations of a transistor; and
    a change determination circuit configured to enable any one of a plurality of determination signals based on the voltage level of the detection voltage,
    wherein the change determination circuit compares the voltage level of the detection voltage with a plurality of target voltages to enable any one of the plurality of determination signals.

2. The semiconductor device of claim 1, further comprising a variable timing circuit configured to determine a delay amount in response to the determination signals and to delay and output an input signal by the determined delay amount.

3. The semiconductor device of claim 1, wherein the transistor comprises a first transistor and a second transistor, and an amount of a change of a first transistor is different from that of a second transistor in accordance with the PVT variations.

4. The semiconductor device of claim 3, wherein the first transistor and the second transistor are of the same type.

5. The semiconductor device of claim 4, wherein the first transistor and the second transistor are both n-channel metal oxide semiconductor (NMOS) transistors.

6. The semiconductor device of claim 3, wherein the voltage level of the detection voltage varies in accordance with the amounts of the changes of the first and second transistors.

7. The semiconductor device of claim 6, wherein the first and second transistors have different channel widths and different channel lengths.

8. The semiconductor device of claim 6, wherein the first and second transistors have different channel widths or different channel lengths.

9. The semiconductor device of claim 8, wherein the first and second transistors have the different channel lengths and substantially a same channel width.

10. The semiconductor device of claim 8, wherein the first and second transistors have the different channel widths and substantially a same channel length.

11. The semiconductor device of claim 1, wherein the change determination circuit comprises:
    a target voltage generation circuit configured to generate the target voltages;
    a plurality of comparison circuits configured to compare the detection voltage with the target voltages to generate a plurality of comparison signals; and
    a decoding circuit configured to decode the comparison signals to enable any one of the determination signals.

12. The semiconductor device of claim 11, wherein the target voltage generation circuit distributes an external voltage to generate the target voltages having different levels.

13. The semiconductor device of claim 12, wherein a first target voltage of the target voltages is higher than a second target voltage of the target voltages.

14. The semiconductor device of claim 13,
    wherein a first comparison circuit of the comparison circuits compares the detection voltage with the first target voltage, and
    wherein a second comparison circuit of the comparison circuits compares the detection voltage with the second target voltage.

15. The semiconductor device of claim 14,
wherein the first comparison circuit enables a first comparison signal of the comparison signals when the detection voltage is higher than the first target voltage, and disables the first comparison signal when the detection voltage is lower than the first target voltage; and wherein the second comparison circuit enables a second comparison signal of the comparison signals when the detection voltage is higher than the second target voltage, and disables the second comparison signal when the detection voltage is lower than the second target voltage.

16. The semiconductor device of claim 15, wherein the decoding circuit is configured to:
enable a first determination signal of the determination signals when both the first comparison signal and the second comparison signal are enabled;
enable a second determination signal of the determination signals when the first comparison signal is disabled and the second comparison signal is enabled; and
enable a third determination signal of the determination signals when both the first comparison signal and the second comparison signal are disabled.

17. A semiconductor device comprising:
a change detection circuit including at least one transistor for detecting process, voltage, and temperature (PVT) variations, and configured to generate a detection voltage having a voltage level varied in accordance with the PVT variations of a transistor; and
a change determination circuit configured to enable any one of a plurality of determination signals, each of the determination signals being independent of each other, based on the voltage level of the detection voltage, which reflects the PVT variations.

* * * * *